(12) United States Patent
Anidjar et al.

(10) Patent No.: US 7,965,133 B2
(45) Date of Patent: Jun. 21, 2011

(54) COMPENSATION TECHNIQUES FOR REDUCING POWER CONSUMPTION IN DIGITAL CIRCUITRY

(75) Inventors: Joseph Anidjar, Asbury, NJ (US); Mohammad S. Mobin, Orefield, PA (US); Gregory W. Sheets, Breinigsville, PA (US); Vladimir Sindalovsky, Perkasie, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 518 days.

(21) Appl. No.: 12/160,373

(22) PCT Filed: Oct. 31, 2007

(86) PCT No.: PCT/US2007/083168
§ 371 (c)(1),
(2), (4) Date: Jul. 9, 2008

(87) PCT Pub. No.: WO2009/058141
PCT Pub. Date: May 7, 2009

(65) Prior Publication Data
US 2010/0244937 A1 Sep. 30, 2010

(51) Int. Cl.
*G05F 1/10* (2006.01)
(52) U.S. Cl. ......... 327/544; 327/540; 327/362; 327/378
(58) Field of Classification Search .................. 327/538, 327/540, 544, 362, 378
See application file for complete search history.

(56) References Cited

U.S. PATENT DOCUMENTS

| | | | |
|---|---|---|---|
| 5,337,254 | A | 8/1994 | Knee et al. |
| 7,551,020 | B2 * | 6/2009 | Bhattacharya et al. ....... 327/538 |
| 2002/0030521 | A1 | 3/2002 | Mizuno et al. |
| 2004/0183588 | A1 | 9/2004 | Chandrakasan et al. |

FOREIGN PATENT DOCUMENTS
WO PCT/US2007/083168 7/2008

OTHER PUBLICATIONS

D. Ernst et al., "Razor: A low-Power Pipeline Based on Circuit-Level Timing Speculation," IEEE, Proceedings of the 36th International Symposium on Microarchitecture, Dec. 2003, pp. 7-18.*
H. Kaul et al., "DVS for On-Chip Bus Designs Based on Timing Error Correction," IEEE, Proceedings of the Design, Automation and Test in Europe Conference and Exhibition, Mar. 2005, pp. 80-85.

* cited by examiner

*Primary Examiner* — Long Nguyen
(74) *Attorney, Agent, or Firm* — Ryan, Mason & Lewis, LLP

(57) ABSTRACT

A compensation circuit for reducing power consumption in at least one digital circuit includes a first sample circuit connected to a first supply voltage, a second sample circuit connected to a second supply voltage, and a controller connected to the first and second sample circuits. The first and second sample circuits are substantially functionally equivalent to one another but optimized for different regions of operation within a specified range of PVT conditions. The controller is operative to receive respective output signals from the first and second sample circuits, to monitor a functionality of the second sample circuit relative to the first sample circuit, and to adjust a level of the second supply voltage to ensure correct operation of the second sample circuit throughout the specified range of PVT conditions. The digital circuit is operative from the second supply voltage.

21 Claims, 3 Drawing Sheets

COMPENSATION TECHNIQUES FOR REDUCING POWER CONSUMPTION IN DIGITAL CIRCUITRY

FIELD OF THE INVENTION

The present invention relates generally to electronic circuits, and more particularly relates to techniques for reducing power consumption in electronic circuitry.

BACKGROUND OF THE INVENTION

Certain electrical characteristics of modern digital circuitry (e.g., a serializer/deserializer (SerDes)) are often susceptible to variations in manufacturing process, power supply voltage and/or temperature (hereinafter referred to as "PVT") conditions to which the circuitry may be subjected in a given application. Electrical characteristics which may be affected by such variations in PVT conditions include, but are not limited to, set-up and hold times, voltage drop (also referred to as current×resistance (IR) drop), delay, etc. Tight control over one or more of these electrical characteristics may be required in order to meet certain performance specifications for a given application of the circuitry.

In order to operate reliably over a specified PVT range, digital circuitry is conventionally designed for a worst-case (e.g., slowest) combination of PVT conditions. This approach, however, will typically yield a circuit which is over designed, and therefore too robust, for more favorable conditions under which the circuit will nominally operate. When process, power supply voltage and/or temperature deviate from worst-case conditions for which the circuit is designed to operate, the over designed circuit will undesirably consume significantly more power than is otherwise necessary for reliable operation of the circuit under those more favorable conditions. Additionally, a circuit designed for worst-case PVT conditions generally possesses a larger gate count than is otherwise necessary for reliable operation under more favorable conditions. This larger gate count results in a larger integrated circuit (IC) which is more costly to fabricate.

It is known to employ fuse programming and laser trimming in a wafer testing procedure (e.g., pre-packaging) in order to compensate the digital circuitry for delay variations due primarily to IC processing. However, this approach significantly increases IC testing time and, moreover, does not provide an adequate means of compensating the circuitry for variations in supply voltage and/or temperature.

Accordingly, there exists a need for techniques which would enable digital circuitry to operate reliably within a specified PVT range with reduced power consumption, and that does not suffer from one or more of the problems exhibited by conventional circuit design approaches.

SUMMARY OF THE INVENTION

Illustrative embodiments of the present invention meet the above-noted need by providing techniques for reducing power consumption in an IC comprising digital circuits. Moreover, techniques of the present invention do not significantly increase the size, and therefore the cost, of the IC. To accomplish this, an illustrative embodiment of the invention provides a compensation circuit which monitors PVT conditions and dynamically adjusts a supply voltage to one or more digital circuits on the IC so as to maintain the supply voltage at a lowest level necessary to support functionality of the digital circuits within a specified range of PVT conditions. Accordingly, power consumption in the IC can be significantly reduced compared to standard approaches.

In accordance with one embodiment of the invention, a compensation circuit for reducing power consumption in at least one digital circuit includes first and second sample circuits. The first sample circuit is connected to a first supply voltage and is operative throughout a specified range of PVT conditions. The second sample circuit is connected to a second supply voltage and is configured to model one or more performance characteristics of the digital circuit. The first and second sample circuits are substantially functionally equivalent to one another but optimized for different regions of operation within the specified range of PVT conditions. The compensation circuit further includes a controller operative: to receive respective output signals from the first and second sample circuits so as to monitor a functionality of the second sample circuit relative to the first sample circuit; and to adjust a level of the second supply voltage to ensure correct operation of the second sample circuit throughout the specified range of PVT conditions, the digital circuit being operative from the second supply voltage. One or more of such compensation circuits may be formed in an integrated circuit.

In accordance with another embodiment of the invention, a method for compensating at least one digital circuit over variations in at least one of process and temperature conditions to which the digital circuit may be subjected is provided. The method includes the steps of: monitoring a functionality of a first sample circuit connected to a first supply voltage relative to a second sample circuit connected to a second supply voltage, the first sample circuit being operative throughout a specified range of PVT conditions, the second sample circuit being configured to model one or more performance characteristics of the digital circuit, the first and second sample circuits being substantially functionally equivalent to one another but optimized for different regions of operation within the specified range of PVT conditions; and adjusting a level of the second supply voltage to ensure correct operation of the second sample circuit throughout the specified range of PVT conditions, the digital circuit being operative from the second supply voltage.

In accordance with yet another embodiment of the invention, a voltage supply compensation system is provided. The system includes at least one digital circuit to be compensated for variations in at least one of process and temperature conditions to which the digital circuit may be subjected, and at least one compensation circuit connected to the digital circuit. The compensation circuit includes first and second sample circuits. The first sample circuit is connected to a first supply voltage and is operative throughout a specified range of PVT conditions. The second sample circuit is connected to a second supply voltage and is configured to model one or more performance characteristics of the digital circuit. The first and second sample circuits are substantially functionally equivalent to one another but optimized for different regions of operation within the specified range of PVT conditions. The compensation circuit further includes a controller operative: to receive respective output signals from the first and second sample circuits so as to monitor a functionality of the second sample circuit relative to the first sample circuit; and to adjust a level of the second supply voltage to ensure correct operation of the second sample circuit throughout the specified range of PVT conditions, the digital circuit being operative from the second supply voltage.

These and other features, objects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative compensation circuit including a PVT monitor and a voltage regulator. It should be understood, however, that the present invention is not limited to this or any other particular circuit arrangements. Rather, the invention is more generally applicable to techniques for reducing power consumption in digital circuitry by controlling a voltage supply level of the digital circuitry as a function of process and temperature conditions.

Although implementations of the present invention are described herein with specific reference to p-channel metal-oxide-semiconductor (PMOS) and n-channel metal-oxide-semiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
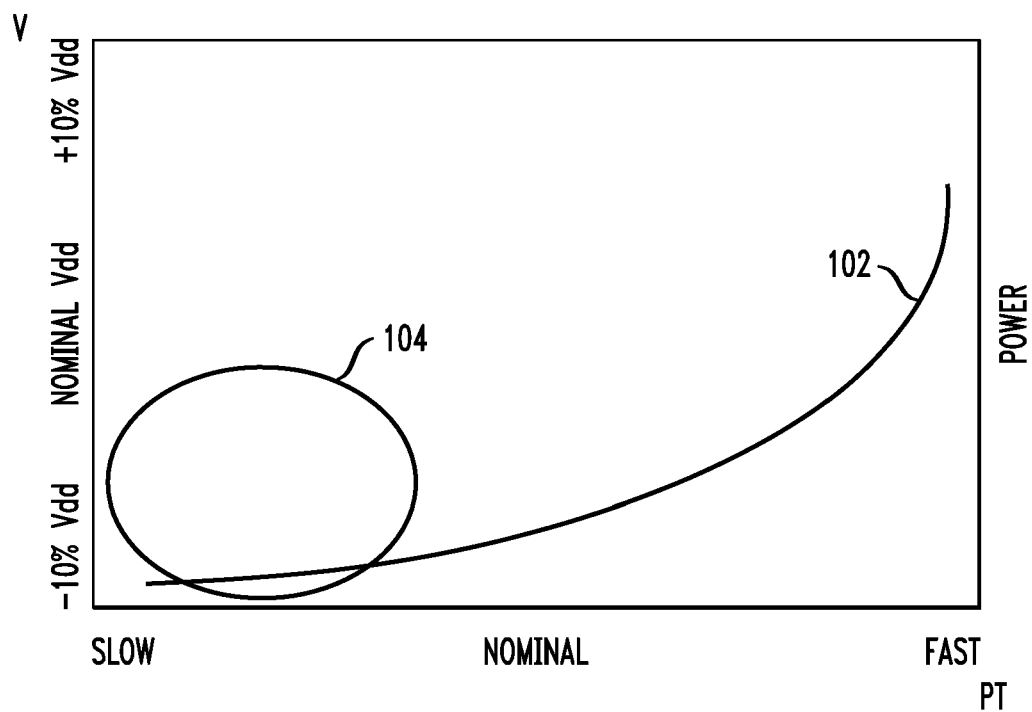
FIG. 1 is a graph depicting power consumption in an exemplary circuit designed to meet prescribed performance specifications for worst-case process and temperature conditions at minimum specified supply voltage.

FIG. 1 illustrates a graph 102 depicting power consumption in an exemplary circuit designed to meet prescribed performance specifications for worst-case process and temperature (PT) conditions at minimum specified supply voltage. Worst-case PVT conditions in this case is indicative of, for example, slow IC process, minimum specified supply voltage (e.g., ten percent below nominal Vdd), and maximum specified temperature (e.g., 125 degrees Celsius). Most circuit design effort is often expended in a single area 104 of graph 102, which is representative of worst-case process and temperature conditions and minimum specified supply voltage. As shown, the exemplary circuit is optimized to consume minimum power and provide specified functionality under such worst-case PVT conditions.

Setup and hold times are a preferred benchmark for evaluating digital circuit performance under various PVT conditions to which the circuit is subjected, although other performance evaluation methodologies may be similarly employed. Circuit timing analysis techniques may be utilized as a means of measuring setup and hold times of a circuit and their compliance with the requirements of a particular library in use, as will be known by those skilled in the art. For example, NanoTime is a transistor-level static timing analysis tool for custom IC designs which is commercially available from Synopsys, Inc. PrimeTime® (a registered trademark of Synopsys, Inc.) is a timing analysis tool for standard cell digital designs.

As apparent from graph 102, for a circuit designed to meet prescribed performance specifications under worst-case PVT conditions, the lowest power consumption in the circuit will occur when the IC process and temperature are at the slowest specified corner and the supply voltage is at the minimum specified potential. One disadvantage of this approach, however, is that as PVT conditions become more favorable and deviate from worst-case, power consumption in the circuit will increase significantly. Additionally, to design a circuit for worst-case process and temperature at minimum supply voltage, a larger gate count is typically required, thereby increasing the overall size and cost of the IC device.

Figure 2:
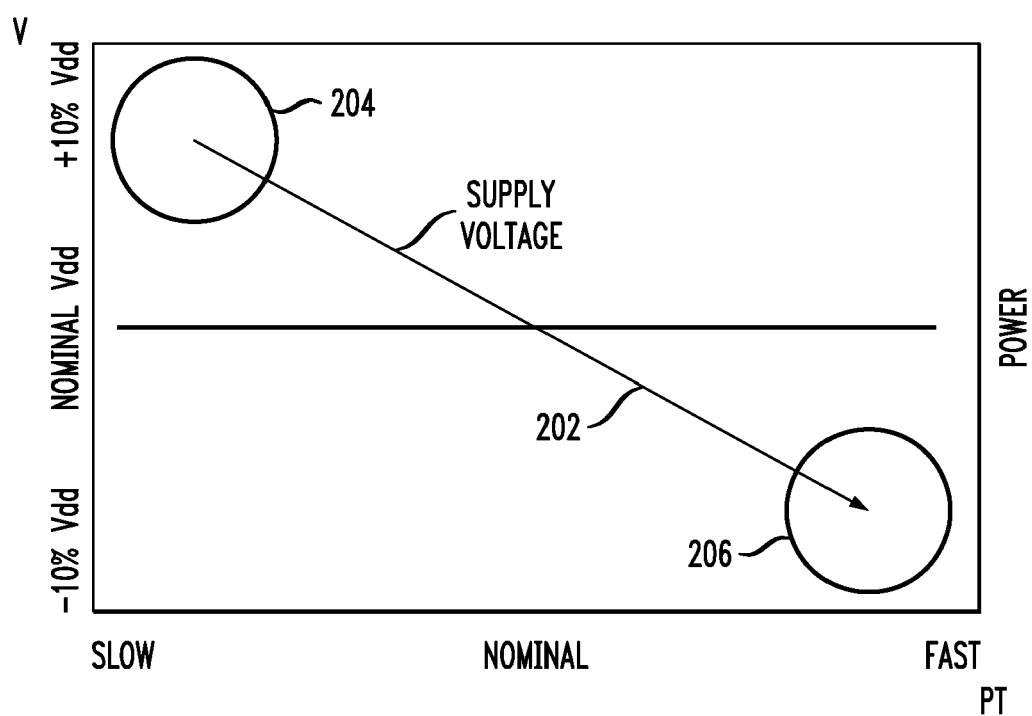
FIG. 2 is a graph depicting power consumption in an exemplary circuit designed to meet prescribed performance specifications for worst-case process and temperature conditions at a maximum specified supply voltage, in accordance with an embodiment of the present invention.

In accordance with illustrative embodiments of the invention, FIG. 2 is a graph 202 depicting power consumption in an exemplary circuit designed to meet prescribed performance specifications for worst-case process and temperature (PT) conditions at a specified maximum (e.g., best-case) supply voltage (e.g., ten percent above nominal Vdd). Area 204 on graph 202 represents worst-case process and temperature conditions at maximum supply voltage. An advantage of this circuit design approach is that as conditions become more favorable by deviating from worst-case process and temperature, supply voltage may be reduced to a level which ensures that the prescribed circuit performance specifications are met but at reduced power consumption. Area 206 on graph 202 represents lowest supply voltage required to meet the performance specification under best-case process and temperature conditions. Power consumption over process and temperature variations is relatively constant in this case.

Power consumed in a digital CMOS circuit can be attributed to three principal sources: dynamic power dissipation, due primarily to load capacitance charging, short-circuit power dissipation, and leakage. The dynamic power dissipation due to load capacitance charging, $P_c$, can be described in accordance with the following expression (assuming load capacitances are charged to Vdd and discharged to 0):

$$P_c = C_L \cdot F \cdot Vdd^2,$$

where $C_L$ represents the value (in Farads) of capacitive load, F represents switching frequency (in Hertz), and Vdd represents supply voltage (in volts). Likewise, short-circuit power dissipation, $P_{SC}$, can be described in accordance with the following expression:

$$P_{SC} = \frac{\beta}{12} \cdot (Vdd - V_T)^3 \cdot \tau \cdot F,$$

where $\beta$ represents a metal-oxide-semiconductor (MOS) gain factor, $V_T$ represents MOS threshold voltage, and $\tau$ represents maximum rise or fall time.

As can be seen from the above expressions, dynamic power dissipation increases with power supply voltage, at least as a power of two. Additionally, it is sufficient to state that leakage power, which is power dissipation due to leakage current paths in the IC, is roughly proportional to power supply voltage.

The performance of a given circuit usually enhances as the power supply voltage increases. Hence, if the timing for a given digital circuit design is closed for slowest process and highest temperature and the maximum specified supply voltage, then circuit performance can be maintained for a more favorable process and temperature at a lower supply voltage, thereby keeping power dissipation at the lowest possible level for any combination of process and temperature conditions. By dynamically controlling the supply voltage to the given circuit over variations in temperature, among other performance characteristics of the circuit, illustrative embodiments of the invention are beneficially able to maintain proper operation of the circuit within prescribed specifications but at reduced power consumption.

Figure 3:
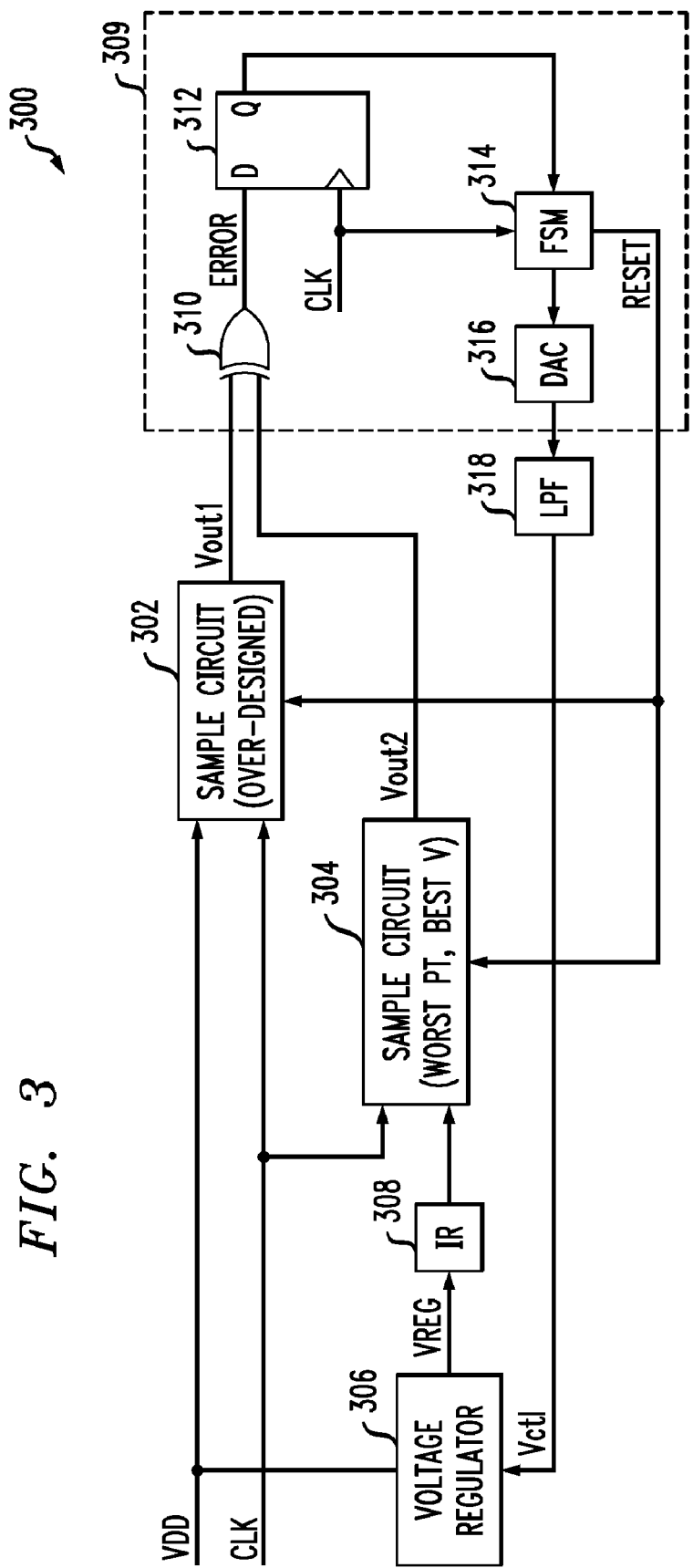
FIG. 3 is a schematic diagram depicting at least a portion of an exemplary compensation circuit, in accordance with an embodiment of the present invention.

FIG. 3 is a schematic diagram depicting at least a portion of an exemplary compensation circuit 300, formed in accordance with an embodiment of the invention. Compensation circuit 300 comprises a first sample circuit 302 supplied from a non-regulated voltage supply, which may be VDD, and a second sample circuit 304 supplied from a controlled voltage supply source, which may be voltage regulator 306. Voltage regulator 306 is preferably connected to VDD and is operative to generate a regulated supply voltage, VREG, which is controlled as a function of at least one control signal, Vct1, supplied to the voltage regulator. The regulated supply voltage VREG is preferably used to power one or more other digital circuits in the IC.

A current×resistance (IR) block 308 may be included in series with the regulated voltage supply (e.g., between the voltage regulator 306 and the second sample circuit 304) to emulate worst-case power distribution in the IC. IR drop in an IC may be a result of, for example, parasitic resistance associated with current carrying voltage supply conductors (e.g., supply voltage bus), which can vary as a function of circuit layout geometries (e.g., conductor length and width), and conductor material type (e.g., aluminum, polysilicon, copper, etc.), among other properties of the IC (e.g., doping material type, doping density, etc.). The IR block 308, which may be implemented in an illustrative embodiment as a simple resistor, will increase a supply voltage margin to the one or more other digital circuits in the IC, supplied from VREG.

First and second sample circuits 302 and 304, respectively, are functionally equivalent to one another, or at least substantially equivalent, but are optimized for different regions in a specified range of PVT conditions to which the circuits may be subjected. For example, first sample circuit 302 is designed for prescribed worst-case PVT conditions (e.g., minimum allowable supply voltage, slowest process and slowest temperature), and thus represents an over-designed version of the sample circuit. Second sample circuit 304 is preferably designed for worst-case process and temperature conditions at a specified maximum supply voltage.

Sample circuits 302 and 304 are preferably digital circuits, including, for example, combinational logic circuits. Second sample circuit 304 is configured to model one or more other digital circuits in the IC to be compensated, at least in terms of prescribed performance characteristics of the circuits, including, for example, propagation delay, setup and hold time requirements and the set of library cells in use. The regulated supply voltage VREG is supplied to the one or more other circuits in the IC which, like second sample circuit 304, are preferably designed for worst-case process and temperature conditions at a specified maximum supply voltage. Consequently, second sample circuit 304 is adapted to track variations in PVT conditions in substantially the same manner as the one or more other circuits in the IC.

As previously stated, setup and hold times are a good benchmark for evaluating circuit performance under various PVT conditions to which the circuit is subjected, although other performance evaluation methodologies are similarly contemplated. Using first sample circuit 302 as a reference standard, second sample circuit 304 is compared relative to the first sample circuit to determine whether or not the second sample circuit is functioning properly under variations in PVT conditions to which the circuits are subjected. In order to perform this comparison, compensation circuit 300 includes a controller 309 operative to receive a first output signal, Vout1, generated by first sample circuit 302 and a second output signal, Vout2, generated by second sample circuit 304 and to generate the control signal Vct1 as a function of the first and second output signals for controlling a magnitude of the regulated supply voltage VREG generated by voltage regulator 306. Controller 309, in conjunction with voltage regulator 306, are operative to monitor a functionality of the second sample circuit 304 and to dynamically adjust a level of the regulated supply voltage VREG so as to ensure correct operation of the second sample circuit throughout a specified range of PT conditions. It is assumed that the voltage regulator 306 is able to control the regulated supply voltage VREG throughout a substantially entire range of specified supply voltage levels (e.g., ±10 percent of nominal Vdd).

In order to determine proper functionality of second sample circuit 304, both first and second sample circuits 302, 304 are clocked by the same clock signal, CLK, and are reset by the same reset signal, RESET. In this manner, the first and second sample circuits will preferably start and remain synchronized with one another. It is assumed that, when functioning correctly, the output signal Vout1 generated by first sample circuit 302 matches an expected output sequence under all specified PVT conditions. When the output signal Vout2 generated by second sample circuit 304 matches output signal Vout1, it is presumed that second sample circuit 304 is functioning within prescribed specifications for circuit performance.

It is to be understood that the clock signal CLK represents a highest frequency in the domain of circuits supplied by VREG. If the frequency of the clock signal supplied to the one or more other digital circuits in the IC connected to the regulated supply voltage VREG (e.g., for a SerDes application, in different modes supported by SerDes circuitry) changes, then VREG will be changed correspondingly since the setup requirements change as a function of clock frequency. Consequently, compensation circuit 300 preferably not only monitors PT conditions, but also monitors clock speed in the IC, and adjusts the regulated supply voltage VREG accordingly to the clock speed to the sample circuit 302.

Controller 309 preferably includes an exclusive-OR logic gate 310, a flip-flop 312 connected to the exclusive-OR gate, a finite state machine (FSM) 314 connected the flip-flop, and a digital-to-analog converter (DAC) 316 connected to the FSM. Alternative control circuitry is similarly contemplated. Exclusive-OR gate 310 is operative to receive the first and second output signals Vout1 and Vout2, respectively, and to generate an error signal, ERROR, indicative of whether or not a timing failure is present in the second sample circuit 304. Specifically, when the first and second output signals Vout1, Vout2 are the same (e.g., either both Vout1 and Vout2 are a logic high level or Vout1 and Vout2 are a logic low level), the error signal generated by exclusive-OR gate 310 will be a logic low level, representing that the second sample circuit is functioning properly. When the first and second output signals Vout1 and Vout2 are different (e.g., Vout1 is a logic low and Vout2 is a logic high, or Vout1 is a logic high and Vout2 is a logic low), the error signal will be a logic high level indicative of a failure in the second sample circuit 304.

It is to be appreciated that each of the output signals Vout1 and Vout2 generated by the first and second sample circuits 302 and 304, respectively, may comprise multiple bits, as in the case of a data word. Accordingly, Vout1 and Vout2 may represent buses rather than single conductors, as will become apparent to those skilled in the art given the teachings of the invention herein. In this scenario, a separate exclusive-OR gate may be employed corresponding to each bit in the output signals Vout1, Vout2.

The error signal generated by exclusive-OR gate 310 is fed to a data (D) input of flip-flop 312, or alternative latch circuitry. A clock input of the flip-flop preferably receives the same clock signal CLK applied to the first and second sample circuits 302, 304. This allows the rate at which flip-flop 312 samples the error signal to be synchronized with the first and second sample circuits 302, 304. An output (Q) of flip-flop 312 is connected to FSM 314, or alternative control circuit (e.g., processor). FSM 314 generates a digital control signal, as a function of the output of flip-flop 312, which is fed to DAC 316 used to generate the analog control signal Vct1 which is fed back to the voltage regulator 306 for controlling the level of the regulated supply voltage VREG. FSM 314 preferably also issues the RESET signal which is fed to the first and second sample circuits 302, 304 in order to resynchronize the first and second sample circuits after an error is detected. Flip-flop 312 functions primarily to latch a state of the error signal until the next clock cycle. Hence, a control loop, which may comprise sample circuits 302, 304, controller 309 and voltage regulator 306, is provided in compensation circuit 300.

It is to be understood that the invention is not limited to the specific controller arrangement shown, and that alternative control circuit arrangements may be employed. For example, if voltage regulator 306 comprises a voltage source which is controllable as a function of a digital control signal, the output signal from FSM 314 may be used directly to adjust the regulated voltage level and therefore DAC 316 may be omitted.

In order to guarantee stability of the control loop in the compensation circuit 300, the compensation circuit may further include a filter, such as, for example, low pass filter (LPF) 318, connected in series with a feedback path between DAC 316 and voltage regulator 306. LPF 318 may comprise, for example, a digital filter, although alternative filter arrangements are similarly contemplated. LPF 318 is operative to receive the output from DAC 316 and to generate the control signal Vct1 supplied to voltage regulator 306.

An operation of compensation circuit 300 will now be described. The two sample circuits 302, 304 are released from reset substantially simultaneously and start generating corresponding output data according to a predetermined sequence. The output data (which may be multiple bit) from the two sample circuits 302, 304 are compared by controller 309 and whenever they do not match one another, an active (e.g., logic high) error signal is generated indicative of a failure in second sample circuit 304. When a failure is detected in the second sample circuit 304, controller 309 outputs an appropriate control signal which instructs the voltage regulator 306 to increase the level of the regulated supply voltage VREG until second sample circuit 304 begins functioning correctly again. Likewise, controller 309 is preferably operative to generate an appropriate control signal which instructs the voltage regulator 306 to decrease the level of the regulated supply voltage VREG until a failure in the second sample circuit 304 is detected. In this manner, the voltage VREG supplied to the one or more other functional circuits in the IC can be reduced to a minimum level necessary to sustain proper functioning of the one or more circuits over variations in PT conditions to which the circuits may be subjected. This reduces overall power consumption in the IC.

Note that the level of the regulated supply voltage VREG at which second sample circuit 304 starts generating errors should be made higher, by some prescribed margin, than the failure level for the other circuits connected to VREG so as to ensure proper functioning of the other circuits under worst-case conditions. This may be achieved, for example, by increasing the ER drop (e.g., via IR block 308) to second sample circuit 304, or by providing a lower VREG level to second sample circuit 304 compared to the level of VREG supplied to the other circuits.

Each time second sample circuit 304 generates an error, it loses synchronization with first sample circuit 302. Consequently, the two sample circuits are preferably reset after each error condition detected. The reset signal RESET may therefore be generated by FSM 314 every time an error is detected. In one embodiment, the control signal may be logically ORed with, for example, a manual reset signal (not explicitly shown) for generating the reset signal RESET supplied to the first and second sample circuits 302, 304. In this manner, the reset signal will be generated either automatically by the FSM 314 upon indication of an error condition, or by a second control signal, which may be a manual reset signal.

Figure 4:
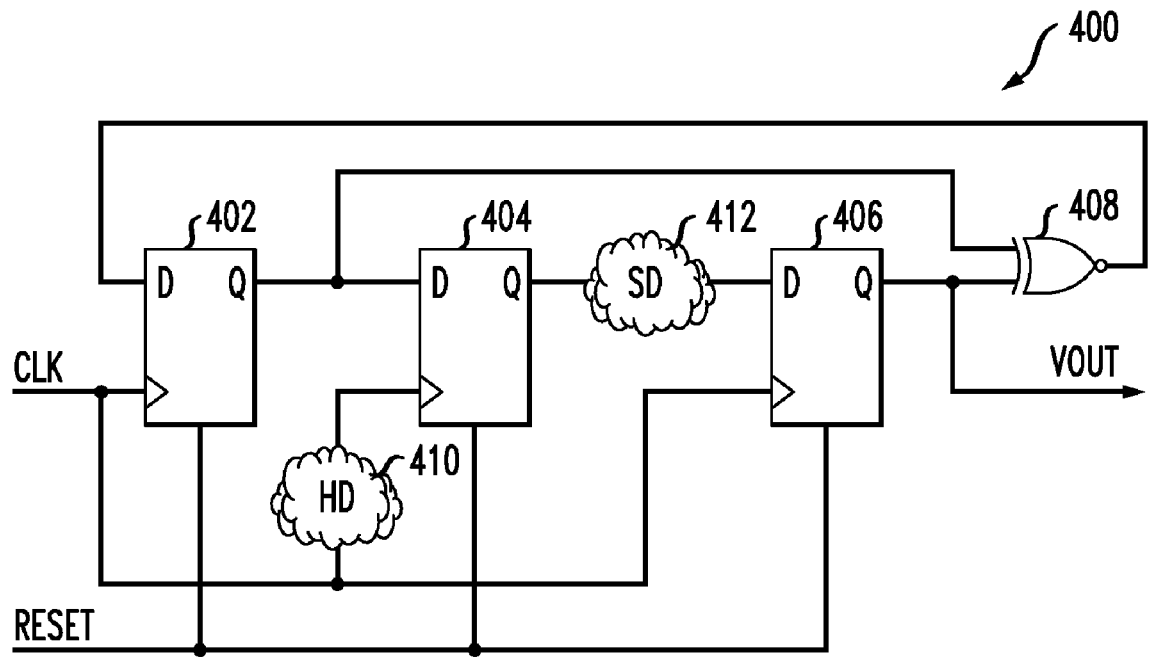
FIG. 4 is a schematic diagram depicting at least a portion of an exemplary sample circuit suitable for use in the compensation circuit shown in FIG. 3, in accordance with an embodiment of the present invention.

By way of example only and without loss of generality, FIG. 4 is a schematic diagram depicting at least a portion of an exemplary sample circuit 400 suitable for use in the compensation circuit 300 shown in FIG. 3, in accordance with an embodiment of the present invention. Sample circuit 400 may be implemented as a simple three-bit pseudo-random sequence generator as shown, although the invention is not limited to any specific circuit configurations.

More particularly, the illustrative sample circuit 400, which may represent an implementation of the first and/or second sample circuit 302, 304 in the compensation circuit 300 of FIG. 3, comprises a first flip-flop 402, a second flip-flop 404 and a third flip-flop 406 connected such that an output (Q) of one flip-flop is supplied to a data input (D) of a subsequent flip-flop, either directly or indirectly. Specifically, the output of first flip-flop 402 is connected to the data input of second flip-flop 404, and the output of the second flip-flop is connected to the data input of third flip-flop 406. The outputs of the first and third flip-flops 402 and 406, respectively, are fed to corresponding inputs of an exclusive-NOR logic gate 408. An output of exclusive-NOR 408 is then fed back to the data input of the first flip-flop 402 to close a loop around the three flip-flops. Each of the flip-flops 402, 404, 406 receives the same clock signal, CLK. Additionally, each of the flip-flops receives the same reset signal, RESET. Hence, the flip-flops are clocked substantially simultaneously and are reset substantially simultaneously by application of the appropriate clock and reset signals, respectively. The output of the third flip-flop 406 preferably forms an output signal, VOUT, of the sample circuit 400.

When released from reset, the respective outputs of the flip-flops will all be the same, namely, logic low. The respective outputs of the first and third flip-flops being the same, exclusive-NOR 408 will generate a logic high output which is clocked into the first flip-flop on the next clock cycle. During this clock cycle, the output of the first flip-flop 402 will be a logic high and the output of the third flip-flop 406 will still be a logic low. With the respective outputs of the first and third flip-flops being different from one another, exclusive-NOR 408 will generate a logic low output which is clocked into the first flip-flop on the next subsequent clock cycle. This pseudo-random pattern will continue.

In order to emulate worst-case setup and hold conditions in the one or more digital circuits connected to the regulated supply voltage VREG generated by compensation circuit 300, additional delay may be added in the second sample circuit 304 (see FIG. 3). The delay may be added in series with at least one of a data signal path and a clock signal path in the second sample circuit 304. This additional delay is represented in sample circuit 400 as delay element 410 (HD) and delay element 412 (SD). Delay element 410 may be connected, for example, in series with the clock input to second flip-flop 404. Delay element 412 may be connected, for example, in series with the data input to third flip-flop 406. The invention is not limited to the number and/or placement of the delay elements in sample circuit 400. The delay elements 410, 412 may comprise, for example, combinational logic configured to model worst-case setup and hold paths in the one or more other digital circuits in the IC connected to the regulated supply voltage VREG.

When on-chip variation for a given technology is a concern, multiple compensation circuits can be placed at a plurality of different locations on the IC. Placement of the compensation circuits may be based on, for example, process gradient information corresponding to the IC. Alternatively, the compensation circuits may be distributed, for example, substantially uniformly throughout the IC. Regardless of the manner in which the compensation circuits are placed in the IC, each compensation circuit may independently control its own voltage regulator supplying, as an output, a regulated supply voltage VREG to one or more local digital circuits that are within a prescribed vicinity of the compensation circuit.

Alternatively, one voltage regulator may be controlled by multiple compensation circuits, such that the regulated supply voltage VREG is adjusted to meet the worst-case PT conditions detected among multiple sites on the IC. For example, a plurality of compensation circuits distributed among various sites on the IC will generate respective control signals based on corresponding PT conditions detected at the various sites. A single voltage regulator shared by the multiple compensation circuits can be configured to receive the respective control signals from the corresponding compensation circuits (e.g., via a logical OR arrangement) and to adjust the regulated supply voltage as a function of these control signals. When any of the compensation circuits detects an error condition, the regulated supply voltage is preferably increased by a prescribed amount until the error condition is no longer present. Likewise, when none of the compensation circuits detects an error condition, the regulated supply voltage may be decreased.

Figure 5:
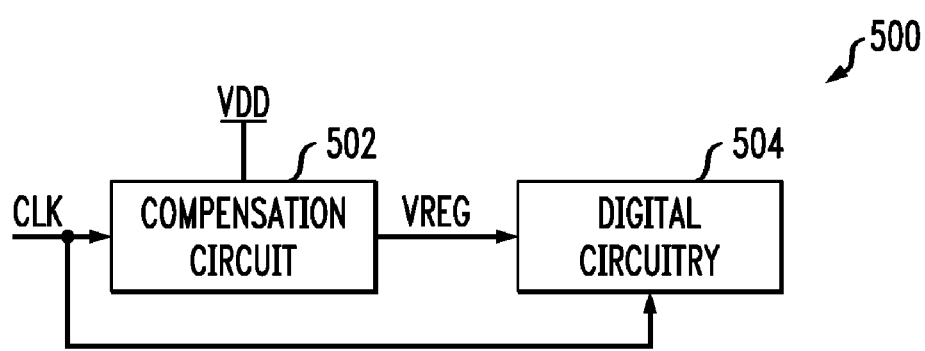
FIG. 5 is a block diagram depicting at least a portion of an exemplary system for compensating digital circuitry, in accordance with an embodiment of the present invention.

FIG. 5 is a block diagram depicting at least a portion of an exemplary system 500 for advantageously compensating digital circuitry, in accordance with an embodiment of the invention. The system 500 includes a compensation circuit 502 connected to voltage supply VDD and digital circuitry 504 connected to the compensation circuit. The digital circuitry 504 includes at least one digital circuit, but may include other circuitry as well, such as, for example, analog circuitry, in the case of a mixed-signal circuit design. Compensation circuit 502 advantageously monitors PT conditions and dynamically adjusts a regulated supply voltage, VREG, provided to the digital circuitry 504 so as to maintain the supply voltage to the digital circuitry at a lowest level necessary to support functionality of the digital circuits within a specified range of PT conditions. In order for the compensation circuit 502 to be synchronized with the digital circuitry 504, the same clock signal, CLK, supplied to the digital circuitry, or some derivative thereof, is preferably supplied to the compensation circuit. Compensation circuit 502 may comprise exemplary compensation circuit 300 shown in FIG. 3, or an alternative circuit arrangement suitable for implementing the functionality of compensating the digital circuitry in accordance with the teachings herein. In this manner, power consumption in the IC can be significantly reduced compared to standard approaches.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with the present invention can be employed in any application and/or electronic system in which it is desirable to reduce power consumption in a digital circuit. Suitable systems for implementing techniques of the invention may include, but are not limited to, personal computers, communication networks, electronic instruments (e.g., automated test equipment (ATE)), interface networks, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A compensation circuit for reducing power consumption in at least one digital circuit connected to the compensation circuit over variations in at least one of process and temperature conditions, the compensation circuit comprising:

a first sample circuit connected to a first supply voltage, the first sample circuit being operative throughout a specified range of process, supply voltage and temperature conditions;

a second sample circuit connected to a second supply voltage, the second sample circuit being configured to model one or more performance characteristics of the at least one digital circuit, the first and second sample circuits being substantially functionally equivalent to one another but optimized for different regions of operation within the specified range of process, supply voltage and temperature conditions; and a controller operative to receive respective output signals from the first and second sample circuits so as to monitor a functionality of the second sample circuit relative to the first sample circuit; and to adjust a level of the second supply voltage to ensure correct operation of the second sample circuit throughout the specified range of process, supply voltage and temperature conditions, the at least one digital circuit being operative from the second supply voltage.

2. The compensation circuit of claim 1, wherein the controller is operative to dynamically control the second supply voltage so as to maintain a lowest level of the second supply voltage necessary to support functionality of the at least one digital circuit within the specified range of process, supply voltage and temperature conditions.

3. The compensation circuit of claim 1, wherein the controller is operative to reduce a potential of the second voltage supply when the respective output signals from the first and second circuits are of a same logic level relative to one another.

4. The compensation circuit of claim 1, wherein the controller is operative to increase a potential of the second voltage supply when the respective output signals from the first and second circuits are of different logic levels relative to one another.

5. The compensation circuit of claim 1, wherein the first circuit is designed for prescribed worst-case process and temperature conditions at a specified minimum supply voltage, and the second circuit is designed for worst-case process and temperature conditions at a specified maximum supply voltage.

6. The compensation circuit of claim 1, wherein the controller comprises a comparator having a first input for receiving the output signal from the first sample circuit, a second input for receiving the output signal from the second sample circuit, and an output for generating a control signal indicative of whether the first and second inputs are of a same logic level.

7. The compensation circuit of claim 6, further comprising a voltage regulator operative to selectively adjust a level of the second supply voltage as a function of the control signal.

8. The compensation circuit of claim 7, further comprising a filter circuit connected in a feedback configuration between the controller and the voltage regulator, the filter circuit being operative to ensure a stability of a control loop in the compensation circuit.

9. The compensation circuit of claim 6, wherein the comparator comprises an exclusive-OR logic gate including first and second inputs connected to the first and second inputs, respectively, of the comparator, and an output generating the control signal.

10. The compensation circuit of claim 6, wherein the controller further comprises a latch circuit operative to at least temporarily store a state of the control signal generated by the comparator, the latch being synchronized with the first and second sample circuits.

11. The compensation circuit of claim 1, wherein the controller comprises:
a comparator having a first input for receiving the output signal from the first sample circuit, a second input for receiving the output signal from the second sample circuit, and an output for generating an error signal indicative of whether an error condition is present;
a latch circuit operative to at least temporarily store a state of the error signal generated by the comparator, the latch being synchronized with the first and second sample circuits; and
a finite state machine connected to an output of the latch circuit and being operative to generate a control signal for adjusting the level of the second supply voltage, the finite state machine being synchronized with the first and second sample circuits.

12. The compensation circuit of claim 11, wherein the finite state machine is operative to generate a reset signal for resynchronizing the first and second sample circuits after an error condition is detected.

13. The compensation circuit of claim 11, wherein the controller further comprises a digital-to-analog converter connected to the finite state machine and adapted to receive the control signal and to generate an analog signal indicative of the control signal.

14. The compensation circuit of claim 1, wherein at least one of the first and second sample circuits comprises a pseudo-random sequence generator.

15. The compensation circuit of claim 1, wherein the first and second sample circuits are synchronized by a same clock signal.

16. The compensation circuit of claim 1, wherein at least the second sample circuit comprises at least one delay element in series with at least one of a data signal path and a clock signal path in the second sample circuit, the delay element having a delay value associated therewith that is substantially matched to at least one of a worst-case setup path and a worst-case hold path in the at least one digital circuit.

17. A method for compensating at least one digital circuit over variations in at least one of process and temperature, the method comprising the steps of:
monitoring a functionality of a first sample circuit connected to a first supply voltage relative to a second sample circuit connected to a second supply voltage, the first sample circuit being operative throughout a specified range of process, supply voltage and temperature conditions, the second sample circuit being configured to model one or more performance characteristics of the at least one digital circuit, the first and second sample circuits being substantially functionally equivalent to one another but optimized for different regions of operation within the specified range of process, supply voltage and temperature conditions; and
adjusting a level of the second supply voltage to ensure correct operation of the second sample circuit throughout the specified range of process, supply voltage and temperature conditions, the at least one digital circuit being operative from the second supply voltage.

18. The method of claim 17, wherein the step of monitoring the functionality of the second sample circuit relative to the first sample circuit comprises the steps of:
comparing a first output signal generated by the first sample circuit to a second output signal generated by the second sample circuit; and
generating an error signal indicative of whether the first and second output signals are of different logic levels relative to one another.

19. The method of claim 17, wherein the step of adjusting a level of the second supply voltage comprises dynamically controlling the second supply voltage so as to maintain a lowest level of the second supply voltage necessary to support functionality of the at least one digital circuit within the specified range of process, supply voltage and temperature conditions.

20. A voltage supply compensation system, comprising:
at least one digital circuit to be compensated for variations in at least one of process, supply voltage and temperature conditions; and
at least one compensation circuit connected to the digital circuit, the compensation circuit comprising:
a first sample circuit connected to a first supply voltage, the first sample circuit being operative throughout a specified range of process, supply voltage and temperature conditions;
a second sample circuit connected to a second supply voltage, the second sample circuit being configured to model one or more performance characteristics of the at least one digital circuit, the first and second sample circuits being substantially functionally equivalent to one another but optimized for different regions of operation within the specified range of process, supply voltage and temperature conditions; and a controller operative to receive respective output signals from the first and second sample circuits so as to monitor a functionality of the second sample circuit relative to the first sample circuit; and to adjust a level of the second supply voltage to ensure correct operation of the second sample circuit throughout the specified range of process, supply voltage and temperature conditions, the at least one digital circuit being operative from the second supply voltage.

21. An integrated circuit, comprising at least one compensation circuit according to claim 1.

* * * * *